US011923525B2

(12) United States Patent
Gao

(10) Patent No.: US 11,923,525 B2
(45) Date of Patent: Mar. 5, 2024

(54) AIRFLOW MANAGEMENT METHOD USING CROSSFLOW FAN CONTROL

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 563 days.

(21) Appl. No.: 16/924,076

(22) Filed: Jul. 8, 2020

(65) Prior Publication Data
US 2022/0013832 A1 Jan. 13, 2022

(51) Int. Cl.
*H01M 10/667* (2014.01)
*H01M 10/613* (2014.01)
*H05K 7/20* (2006.01)
*G06F 1/30* (2006.01)

(52) U.S. Cl.
CPC ....... *H01M 10/667* (2015.04); *H01M 10/613* (2015.04); *H05K 7/20745* (2013.01); *H05K 7/20836* (2013.01); *G06F 1/305* (2013.01)

(58) Field of Classification Search
CPC .............. H01M 10/667; H01M 10/613; H05K 7/20745; H05K 7/20836
USPC ....................................................... 454/184
See application file for complete search history.

(56) References Cited

U.S. PATENT DOCUMENTS

| | | | | |
|---|---|---|---|---|
| 7,378,165 B2* | 5/2008 | Brignone | ............. | H01M 8/1011 429/434 |
| 9,839,162 B2* | 12/2017 | Crawford | ............ | H04L 41/0803 |
| 2013/0030735 A1* | 1/2013 | Jau | ........................ | G01R 31/385 702/63 |
| 2015/0093982 A1* | 4/2015 | Bailey | ................. | H01M 50/224 454/184 |
| 2015/0331468 A1* | 11/2015 | Jau | ............................ | G06F 1/30 713/323 |
| 2021/0176889 A1* | 6/2021 | Shao | ..................... | H01M 10/63 |

\* cited by examiner

*Primary Examiner* — Avinash A Savani
*Assistant Examiner* — Dana K Tighe
(74) *Attorney, Agent, or Firm* — WOMBLE BOND DICKINSON (US) LLP

(57) ABSTRACT

Systems and methods for managing airflow in a backup battery unit (BBU) rack are described in the disclosure. In one embodiment, a system includes a BBU rack with a number of BBU modules, the BBU rack configured to power a server rack in a data center. The system further includes one or more crossflow fans, each crossflow fan configured to dynamically adjust its air blowing direction in real time; and a rack management controller that are connected to the server rack, the BBU rack and the one or more crossflow fans. The crossflow fan is equipped with a rotatable frame for airflow variations. The one or more crossflow fans to diffuse cooling air into one or more of the BBU modules in response to a power supply incident after receiving control signals from either a rack management controller and/or the BBU rack controller.

15 Claims, 9 Drawing Sheets

… (1) …

AIRFLOW MANAGEMENT METHOD USING CROSSFLOW FAN CONTROL

FIELD OF THE INVENTION

Embodiments of the present disclosure relate generally to electronic cooling in a battery module. More particularly, embodiments of the disclosure relate to airflow management using a crossflow fan in battery backup unit (BBU) rack.

BACKGROUND

Use of a battery backup unit (BBU) in place of traditional solutions, such as lead-acid based Uninterruptible Power Supply (UPS) systems, has grown in popularity in the vehicle industry and data centers.

BBUs can be arranged into a BBU rack or in a server rack, wherein cooling air can be used to cool battery cells. Moving airflows requires costly equipment, especially for mass-density systems, such as a storage rack or a BBU rack in a data center. Thus, to improve energy efficiency in a mass-density system, it is important to improve efficiency in airflow management.

A BBU rack can be used either as a backup power source or as a supplemental power source to an external system, such as a vehicle or a server rack in a data center. In addition, a BBU rack can also be used for system power management and optimization. Depending on how a BBU rack is used, airflow management can be different. For example, when used as a full backup power source, the entire BBU rack needs cooling air. When used as a supplemental power source or a partial backup power source, only certain BBU modules need enhanced cooling. Further, a BBU rack may also use different configurations to improve the availability of the BBU rack, or increase design flexibility.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiment, described herein are systems and methods for managing airflows in a BBU rack. In one embodiment, a system includes a BBU rack with a number of BBU modules therein, the BBU rack configured to power a server rack in a data center. The system further includes one or more crossflow fans, each crossflow fan configured to dynamically adjust its air blowing direction in real time; and a rack management controller connected to the server rack, the BBU rack and the one or more crossflow fans. The rack management controller can send control signals to the BBU rack to control air chambers therein and to the one or more crossflow fans to diffuse cooling air into one or more of the BBU modules.

In one embodiment, each crossflow fan can include a rotatable vortex adjusting frame for adjusting the location of vortex in the crossflow fan, thereby adjusting the airflow discharge/diffuse direction of the crossflow fan. The rotatable vortex adjusting frame includes a vortex wall and a rear wall combined as a single unit, which is coupled to a rotation part. The rotation part is attached to motor, which can rotate the real wall and the vortex wall in either clockwise or counterclockwise directions. The rotatable vortex adjusting frame enables the crossflow fan to precisely adjust its airflow blowing directions to accurately deliver cooling air to a specific target location in the BBU rack.

Figure 1:
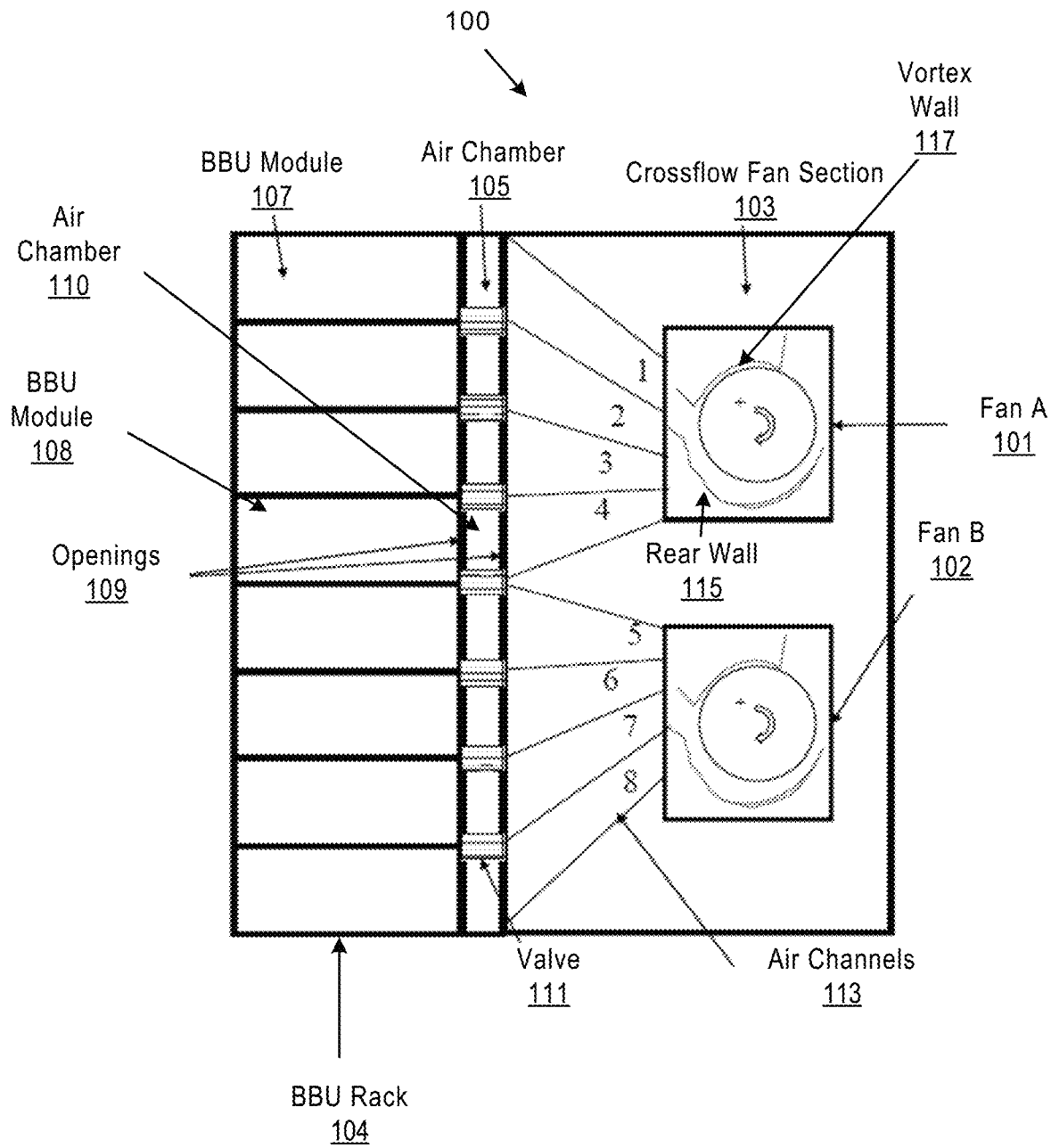
FIG. 1 illustrates a system for managing airflows in a BBU rack according to one embodiment.

FIG. 1 illustrates a system 100 for managing airflows in a BBU rack according to one embodiment.

As shown, the system 100 includes a number of crossflow fans 101 and 102 placed within a crossflow fan section 103, which can be an independent section attached to a BBU rack 104 or part of the BBU rack 104. The BBU rack 104 can include a number of BBU modules (e.g., BBU modules 107 and 108). The system can include an air chamber between the crossflow fan section 103 and each BBU module.

For example, an air chamber 105 is placed between the crossflow fan section 103 and the BBU module 107, and an air chamber 110 is placed between the crossflow fan section 103 and the BBU module 108.

Each BBU module can include battery cells in groups that may be series connected, parallel connected, or a combination thereof. The battery cells may be of any type, such as Lithium-ion, Nickel Cadmium, etc. The battery cells are configured to provide battery energy stored within the battery cells to a load (e.g., the load may be at least one server as described herein), and are configured to draw power from an external power supply (or source) to charge the battery cells. In one embodiment, rather than including multiple battery cells, the module may include only one battery cell.

In one embodiment, each air chamber can function as an air pool that stores cooling air from a crossflow fan, and discharge the pooled cooling air to a corresponding BBU module. Each air chamber has openings (e.g., openings 109) on the side of the BBU module and the side of the crossflow fan section 104. The opening on the side of the crossflow fan section is used to draw cooling air coming out of a crossflow fan (e.g., the crossflow fan 101) into the BBU module. The opening on the side of the BBU module (e.g., BBU module 108) is used to discharge cooling air pooled in the air chamber to the BBU module.

In one embodiment, the pooled cooling air inside each air chamber may be at a higher pressure than the air in a BBU module. The higher pressure may be needed for the cooling air to be pushed into the BBU module to better cool the entire battery cells therein. To maintain the higher pressure, the opening on the side of the BBU module can be smaller than the opening on the side of the crossflow fan section 103. Because of the pressure management, cooling air can be supplied to the BBU module at a higher air velocity than cooling air that the crossflow fan pushes into the air chamber. Thus, the airflow can be more efficiently arranged and delivered to the battery cells in the BBU module, thereby cooling the battery cells in the BBU module more efficiently and/or more rapidly.

In one embodiment, each battery module may include vents that allow warmed air to exit the module. Specifically, a BBU module may include one or more vents or perforated openings on a side of the air chamber and/or may include vents or perforated openings at a back of the BBU module.

As further shown, an air valve (e.g., valve 111) between the air chambers for the BBU modules can be closed or opened as needed. When an air value for an air chamber is closed, the pooled cooling air in the air chamber can be distributed only to the corresponding BBU module. When the air valve for a BBU module is opened, the pooled cooling air can be distributed to a neighboring air chamber, such that the cooling air can be distributed to the BBU module corresponding to the neighboring air chamber. In one embodiment, with all valves open, the pooled cooling air in any air chamber can be used for cooling the entire BBU rack, and fan A 101 and fan B 102 can be understood as back up unit for each other.

In one embodiment, all the air values in the BBU rack 104 can be closed. In this embodiment, each BBU module can be cooled only by cooling air pooled in its corresponding air chamber. This embodiment can be used when the BBU rack is used as a supplemental power source, where only certain BBU module are turned on. In another embodiment, all the air valves in the BBU rack 104 can be opened. In this embodiment, each air chamber can share the pooled cooling air with each other air chamber. This embodiment can be used when the BBU rack 104 is used as a backup power source or as an auxiliary power source in certain power management schemes, where each BBU module is turned on and therefore needs cooling.

As further shown in FIG. 1, each crossflow fan can blow cooling air into 4 BBU modules in the BBU rack 104 via different air channels 113. The number of BBU modules in the BBU rack, the number of crossflow fans, and the number of BBU modules connected to each crossflow fan are provided for the purpose of illustration. It would be apparent to a person skilled in the art that each of the numbers can vary in actual implementations based on system design requirements.

In one embodiment, each crossflow fan can include a rotatable vortex adjusting frame that comprises a rotation part (not shown), a vortex wall, and a rear wall. A motor coupled to the rotation part can receive control signals form a rack management controller, and, in response, operates to rotate the vortex wall and the rear wall to enable the crossflow fan to blow cooling air to a particular air channel.

For example, the crossflow fan 101 include a vortex wall 117 and a rear wall 115. By rotating the vortex wall 117 and the rear wall 115, the crossflow fan 101 can adjust its air blowing direction to accurately diffuse cooling air into 4 corresponding air channels 1, 2, 3, and 4, one at a time. The rear wall 115 is a customized design on its discharging side to match an air channel to eliminate air leakage, and ensure that air is delivered to one of the air channels #1-#8.

In one embodiment, each air channel has a preset angle viewed from the position of the corresponding crossflow fan. Information for the angle of each air channel can be stored in the rack management controller, which uses the information to determine the angle that the rotation vortex adjusting frame needs to rotate in order for the crossflow fan to blow air into a particular air channel.

Figure 2:
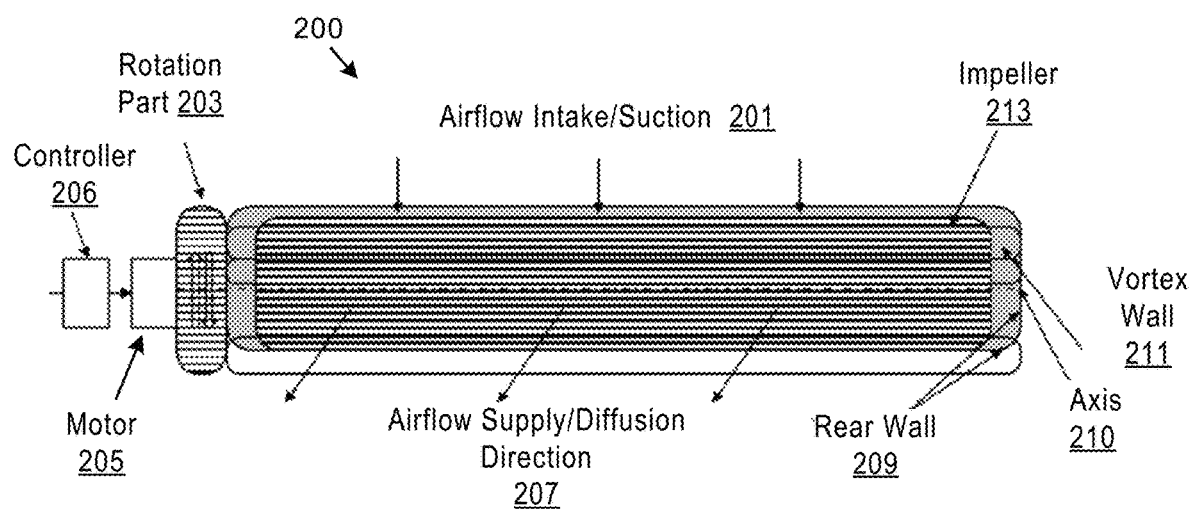
FIG. 2 illustrates an example of a cross-flow fan according to one embodiment.

FIG. 2 illustrates an example of a cross-flow fan according to one embodiment. As shown, a crossflow fan 200 can include a rotation part 203, a vortex wall 211, and a rear wall 209. The three units 203, 211, and 209 are integrated into vortex adjusting frame, which can be rotated to certain predetermined angles.

In one embodiment, the rotation part 203 is coupled to a motor 205, which causes the rotation part 203 to rotate in response to control signals received from a rack management controller 206. Since the three units 203, 211 and 209 are combined into a single unit, the rotation part 203, when rotating around an axis 210, can change the positions of the vortex wall 211 and the rear wall 209 change without changing the relative location of each key unit to an impeller 213 in the crossflow fan 200. However, the rotation part 203 can change an airflow supply/diffusion direction 207 of the crossflow fan 200, since it can change the corresponding absolute vortex location. Similarly, the rotation part 203 can change the corresponding airflow intake location 201.

The rotation part 203 can be rotated clockwise or counterclockwise. FIG. 2 shows an embodiment where the rotation part 203 is rotated clockwise from the perspective of a person standing on the left of the crossflow fan 200. In one embodiment, the impeller 213 can be rotated by the motor 205 or a different motor. In one embodiment, the impeller 213 can be built using standard parts, which may be shorter in length than needed by the crossflow fan 200. Therefore, the impeller 213 may not have the length needed for building the crossflow fan 200. In such a case, multiple impellers such as the impeller 213 can be concatenated in a series manner to form a longer impeller.

For example, if an impeller built using standard parts is 20 cm long but a 40 cm long impeller is needed to build the crossflow fan 200, two 20 cm long impellers can be combined in a series manner to create a 40 cm long impeller.

In one embodiment, the combined impeller can be rotated on one rotation axil, and can have one set of vortex wall and rear wall or two sets of such walls attached to a housing that houses the combined impeller. In one embodiment, different numbers of impellers and such walls can be combined in a crossflow fan 200.

Figure 3:
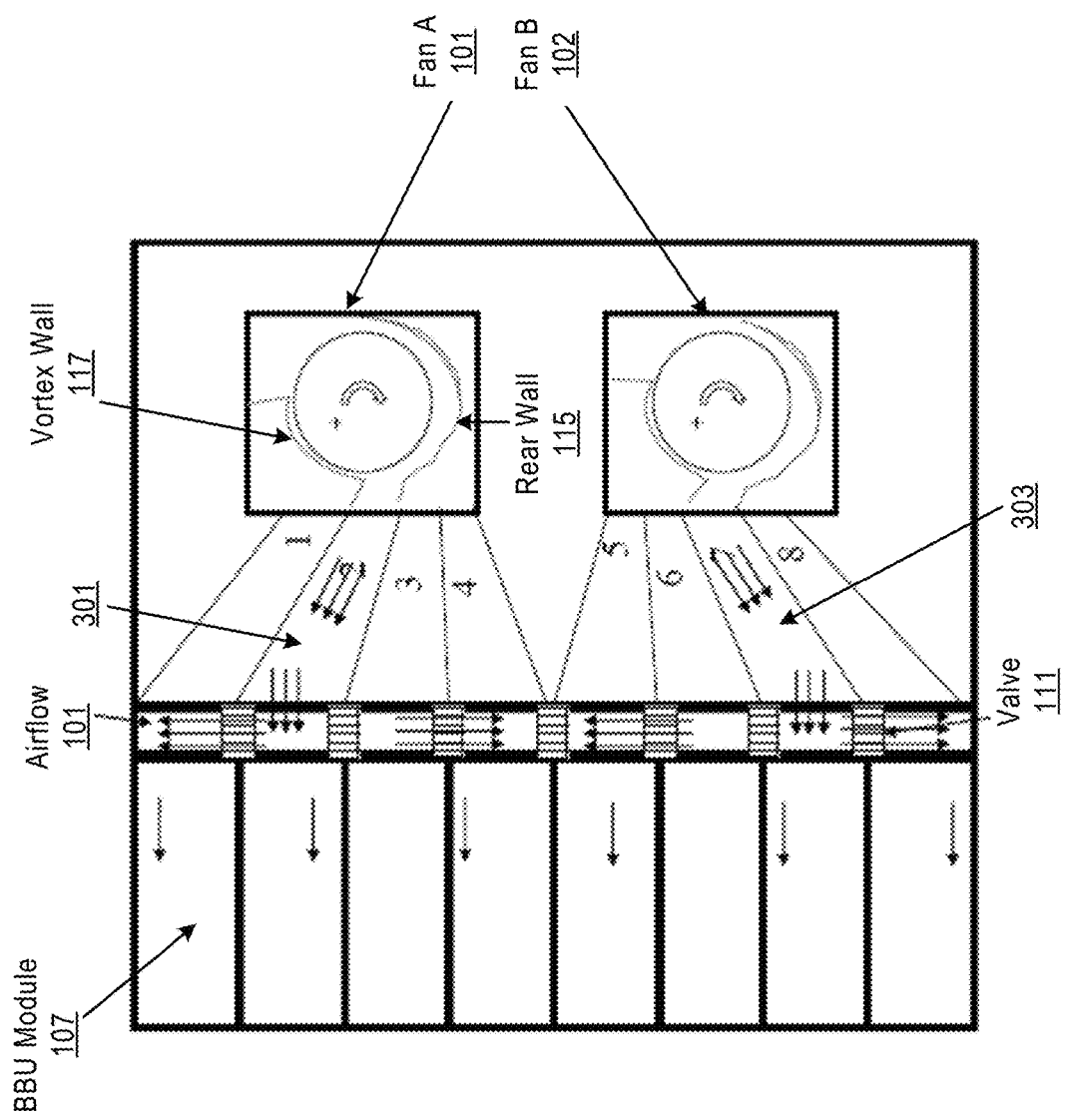
FIG. 3 illustrates a use case of the system in FIG. 2 according to one embodiment.

FIG. 3 illustrates a use case of the system 200 according to one embodiment. In FIG. 2, the crossflow fan 101 blows cooling air to the air channel #2 301 as a result of the rotatable vortex adjusting frame being rotated by a motor in response to control signals from a rack management controller, and the cross fan 102 blows cooling air to the air channel #7 303.

In the use case, all valves between the air chambers in the BBU rack are open. The open valves cause the air chambers to become a single shared region. Therefore, even though the crossflow fans 101 and 102 supply cooling air only to the air channels 301 and 303, all the BBU modules in the BBU rack can receive cooling air. In one embodiment, even if a crossflow fan (the crossflow fan 101 or 102) supplies cooling air to one air channel, all the BBU modules would receive cooling air.

Figure 4:
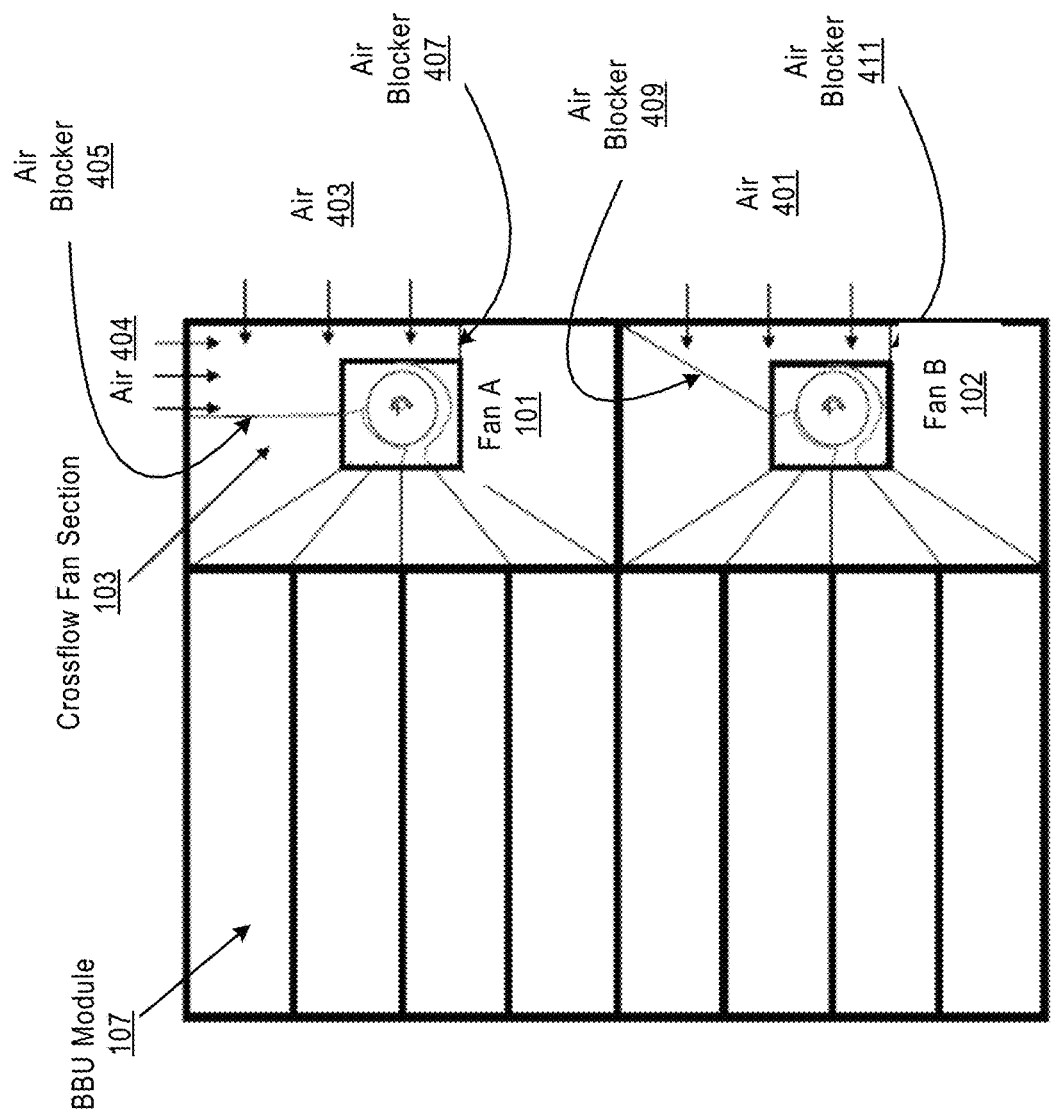
FIG. 4 illustrates an example of a design of a crossflow fan section according to one embodiment.

FIG. 4 illustrates an example of a design of the crossflow fan section 103 according to one embodiment. As shown, the crossflow fan section 103 can include a number of air blockers 405, 407, 409 and 411. The air blocks can provide a structure that mounts the crossflow fans 101 and 102, and also block or separate air 404 sucked in either from the top and air 403 and 401 sucked in from the back of the crossflow fans 101 and 102. The air blockers 405, 407, 409 and 411 and the locations where air is sucked into the crossflow fan section 103 can assist in the formation of laminar airflows.

Figure 5:
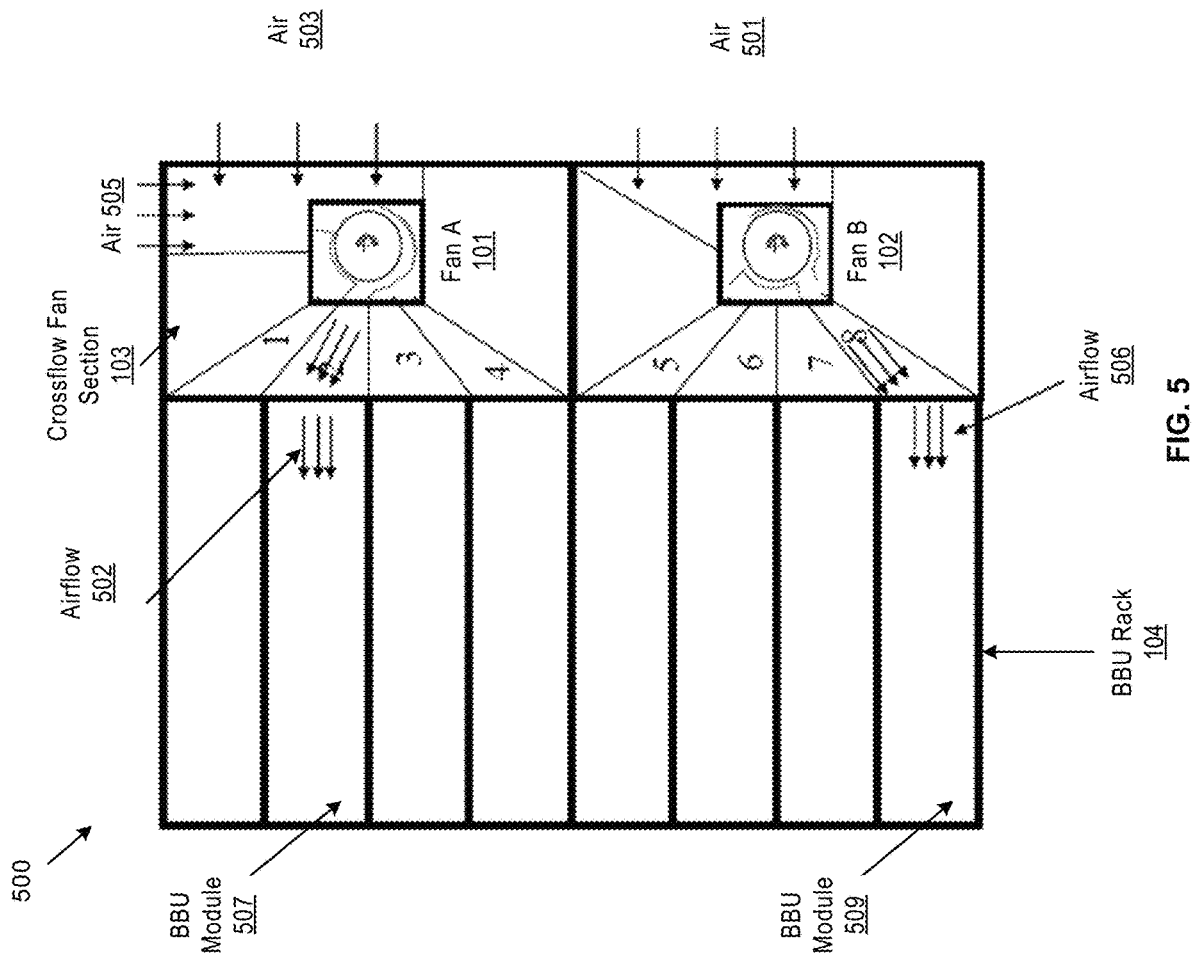
FIG. 5 illustrates an example of a system that operates as a supplemental power source according to an embodiment.

FIG. 5 illustrates an example of a system 500 that operates as a supplemental power source according to an embodiment. For instance, the BBU rack 104 is used as the energy storage for a row of server racks, and the BBU modules 507 and 509 are dedicated to certain one or multiple server racks. If the one or more of server racks require additional power for operating such as in a power management mode, dedicated cooling is needed for the corresponding BBU module in the BBU rack. In another mode, all the BBU modules can be used for any of the server racks through a parallel connecting bus, and therefore, the operating sequence may be starting from a first one of the BBU modules, and changing to a second one of the BBU modules if the first BBU module runs out of energy. In such a scenario, the cooling air delivery will be changed by adjusting a crossflow fan.

As shown, the system 500 does not include any air chamber between the crossflow fan section 103 and the BBU rack 104. Due to the lack of any air chamber, cooling air pushed into any air channel can only be diffused into the corresponding BBU module, and cannot be distributed into any other BBU module.

In one embodiment, the crossflow fan 101 sucks in air 505 and 503 from the top and the back of the fan. The crossflow fan 102 sucks in air 501 from the back only. The air diffusion/blowing direction of the crossflow fan 101 is rotated to air channel #2, and the air diffusion/blowing direction of the crossflow fan 102 is rotated to air channel #8. Airflows 502 and 506 therefore can be accurately delivered to BBU module 507 and BBU module 509 respectively. The BBU modules 507 and 509 in this embodiment are being used to provide additional power or backup energy to a load or a server rack in a data center.

However, in alternative embodiment, an air chamber can be provided between each air channel and its corresponding BBU channel in FIG. 5. The air chamber can have a bigger opening on the side of the air channel and a smaller opening on the side of the BBU to enhance airflow management to the air chamber. However, each air chamber does not need to have an air valve on either side. Used as a supplemental source, the BBU rack 104 only needs to turn on certain BBU modules. The crossflow fans 101 and 102 can be configured to blow cooling air only to those BBU modules, which do not share the cooling air therein with other BBU modules.

Figure 6:
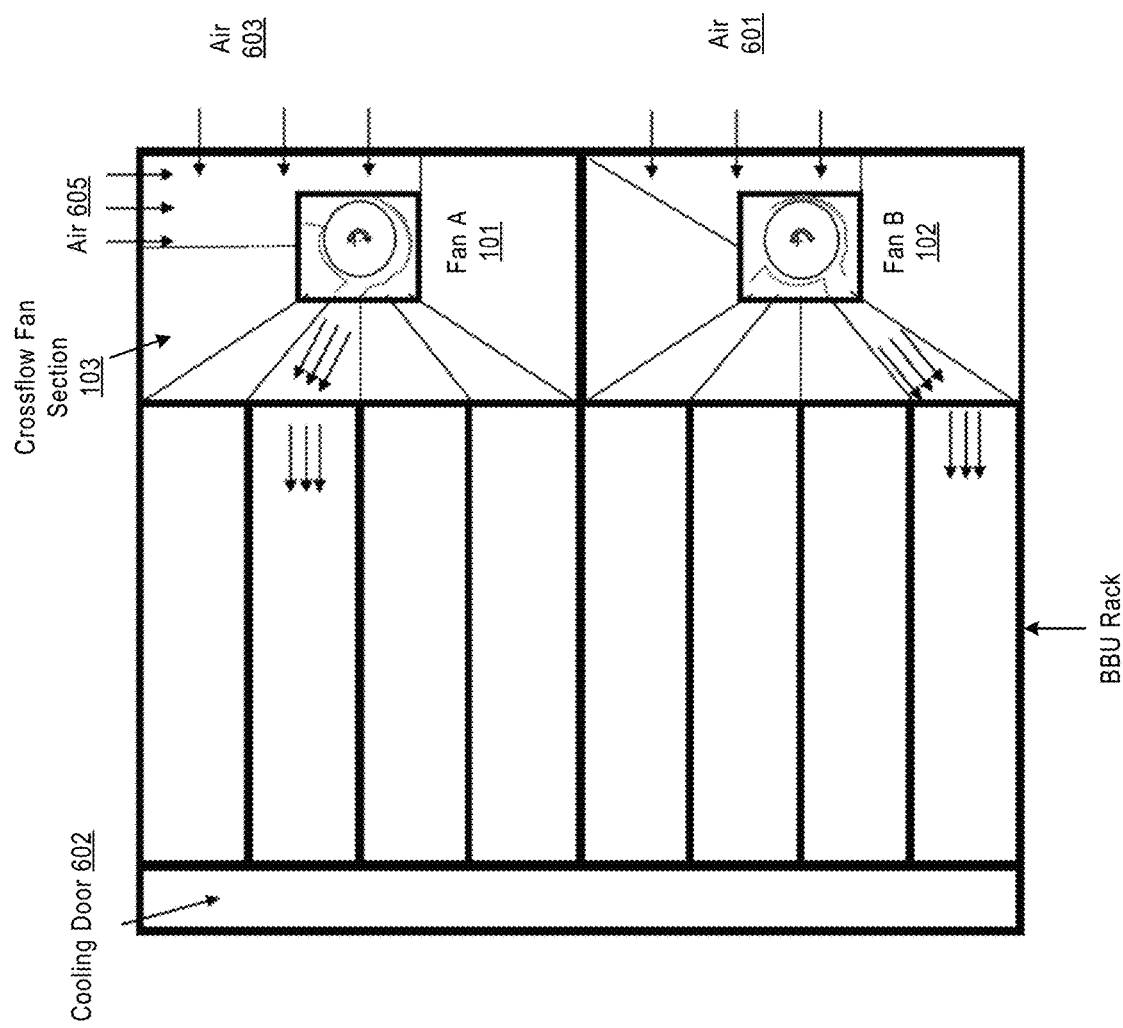
FIG. 6 illustrates the system in FIG. 5 with additional features according to one embodiment.

FIG. 6 illustrates the system 500 with additional features according to one embodiment. The system 500 can include a number of additional features to accommodate different types of data center configurations. For example, a cooling door 602 can be added to the side of the BBU rack that is opposite to the crossflow fan section 103.

In one embodiment, the crossflow fans 101 and 102 can suck in air 605, 603 and 601 from the top and back of the crossflow fans, and blow the air to a particular air channel. The air from the crossflow fans 101 and 102 can become cooling airflows to pass through BBU modules to cool battery cells in the BBU modules.

The cooling airflows entering into the BBU modules can absorb heat generated through forced convection. Specifically, the cooling airflows are pushed towards the battery cells and comes into contact with the hot (or heated) surface of the battery cells. Since the airflows are cooler than the surface, heat is exchanged thereby producing warmed air.

The cooling door 601 in the FIG. 6 can be used to cool the warmed airflows before the warmed airflow exit the BBU rack 104 into a room that houses the BBU rack 104. The cooling door 602 can be either a closed loop or an open loop system. Either single phase cooling fluid or two phase cooling fluid can be used for operating the cooling door 602.

Figure 7:
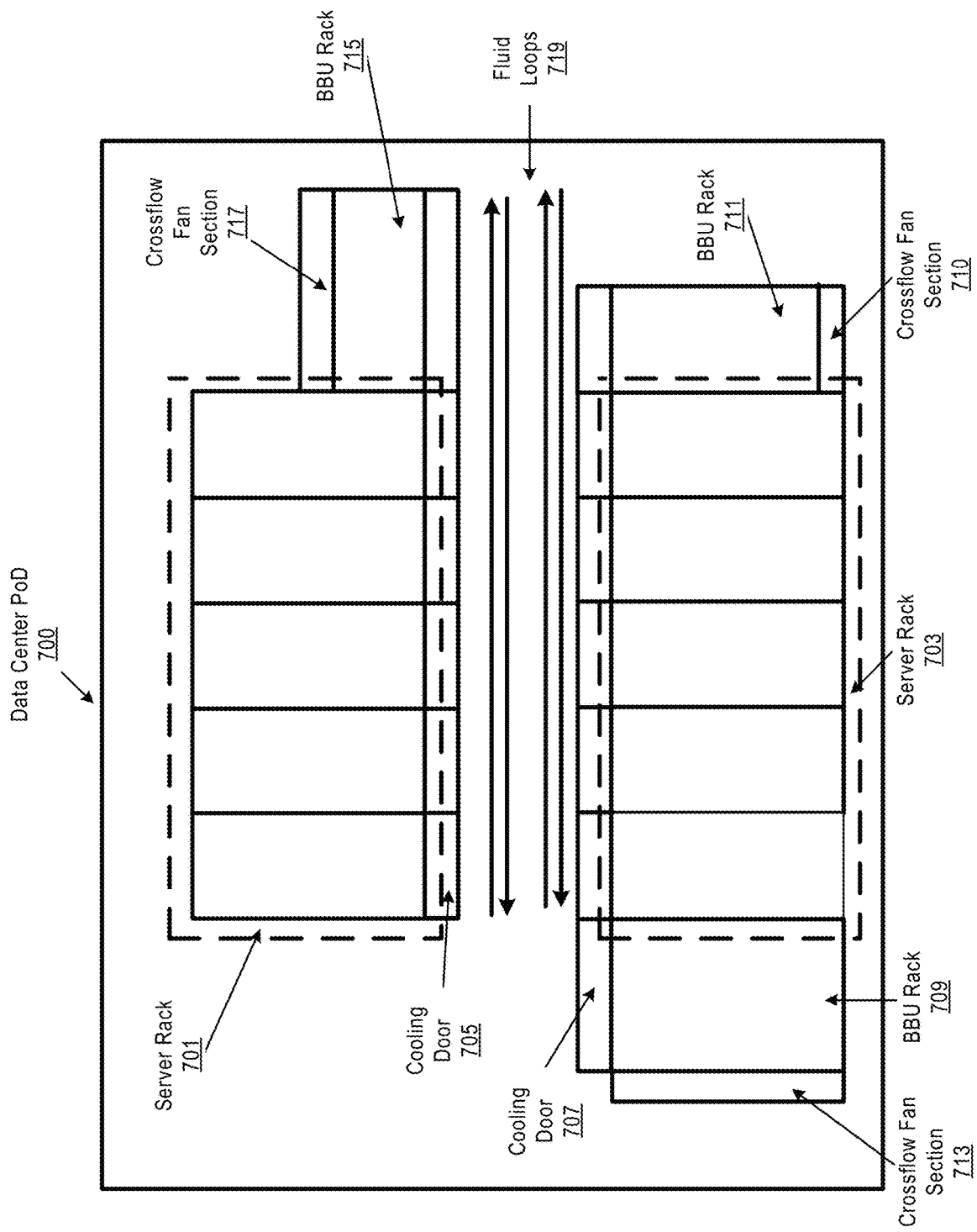
FIG. 7 illustrates a data center PoD according to one embodiment.

FIG. 7 illustrates a data center PoD 700 according to one embodiment. The figure shows an implementation of a BBU rack with crossflow fans in the data center PoD 700.

As used herein, a Pod stands for a point of delivery, which represents a module of network, compute, storage, and application components that work together to deliver networking services. The data center PoD 700 is a repeatable design pattern, and its components maximize the modularity, scalability, and manageability of data centers.

In one embodiment, due to the nature of BBU packaging, different types of BBU racks 709, 711 and 715 can be used. Each BBU rack can have just one or more BBU modules, and uses an air cooling system to cool battery cells in the BBU rack. The BBU racks 709, 711, and 715 are used to power server racks 701 and 703 as a backup source or a supplemental power source. The server racks 701 and 703 each can have a cooling door 705 or 707, and can have fluid loops 719 in between to act as an additional cooling mechanism.

A crossflow fan section can be attached to a side of each BBU rack. For example, a crossflow fan section 713 is attached to the BBU rack 709, a crossflow fan section 710 is attached to the BBU rack 711, and a crossflow fan section 717 is attached to the BBU rack 715.

The combinations of crossflow fan sections and BBU racks represent different configurations. For example, in one configuration, the crossflow fan section 717 is attached to the longer side of the BBU rack 715 to create a larger airflow inlet, which is important when crossflow fans are used. In another configuration, the crossflow fan section 710 is attached to the rear side of the BBU rack 711. In yet another configuration, the crossflow fan section 713 is attached to the side of the BBU rack 709. In this configuration, the BBU rack 709 can be equipped with axial fans, and the crossflow fan section 713 is added for providing additional and local cooling airflows based on actual needs. The different configurations enable implementation of the proposed solution more efficiently in different data center room environments and BBU rack configurations, for different application cases.

Figure 8:
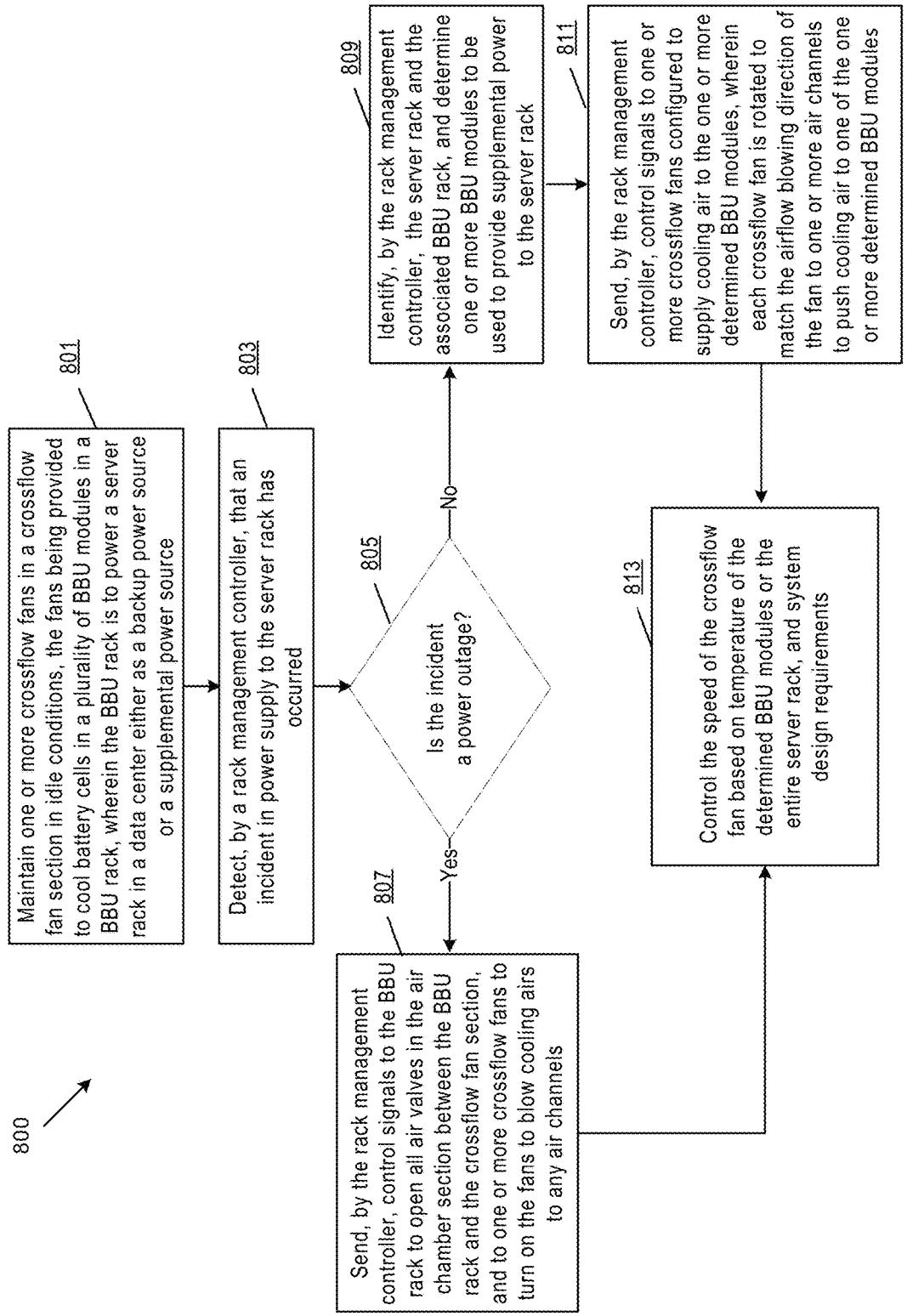
FIG. 8 is a flow diagram illustrating a process of managing airflows using crossflow fans according to one embodiment.

FIG. 8 is a flow diagram illustrating a process 800 of managing airflows using crossflow fans according to one embodiment. Process 800 may be performed by processing logic which may include software, hardware, or a combination thereof. For example, process 800 may be performed by a rack management controller 206 described in FIG. 2.

As shown in the figure, in operation 801, the processing logic maintains one or more crossflow fans in idle conditions or maintain a minimum speed of the fans. The crossflow fans are used to blow cooling airs into a plurality of BBU modules in a BBU rack, which is to power a server rack in a data center either as a backup power source or a supplemental power source. The crossflow fans can be positioned in a crossflow fan section, which is attached to the BBU rack or as part of the BBU rack.

The server rack can be the only server rack in the data center or one of many server racks in the data center. When there are multiple server racks configured as a PoD, each server rack may have a BBU rack attached thereto.

In operation 803, the processing logic detects that an incident has occurred in power supply to the server rack. The incident could be a power outage that causes the server rack to completely lose its power supply, or the server rack exceeding its power rating. When the server rack exceeds its power rating, the existing power supply cannot meet the power demand of the server rack. This could happen in peak hours or when the server rack is processing extremely heavy workloads, causing temporary surge in power consumption.

In operation 805, the processing logic determines which type of incident has occurred.

In operation 807, the processing logic determines that the incident is a power outage, and sends control signals to the BBU rack to open all air valves in the air chamber section. The processing logic also sends control signals to one or more crossflow fans to turn on the fans to blow cooling air to any air channel. Since the air valves are opened, the air chambers are one shared region, and cooling air blown into any of the air chambers can be distributed into all the BBU modules in the BBU rack.

In operation 815, the processing logic controls the speed of the crossflow fan based on the temperature of the entire server rack or system design requirements. For example, if the temperature is higher than a threshold, the processing logic can increase the speed of the crossflow fans. If the temperature of the server rack is lower than the threshold, the processing logic can slow the fan down.

In operation 809, the processing logic determine that the incident is not a power outage, but the server rack exceeding its power rating. The processing logic then identifies the server rack and the associated BBU rack, and determines one or more BBU modules that are to be used to provide supplemental power to the server rack.

In operation 811, the processing logic sends control signals to one or more crossflow fans configured to supply cooling air to the one or more determined BBU modules. Each crossflow fan includes a rotatable vortex adjusting frame, which, when being rotated, can change the airflow blowing direction of the fan. The control signals cause each fan to rotate the vortex adjusting frame of the crossflow fan to match the airflow blowing direction of the fan to one or more air channels, to push cooling air to one of the one or more determined BBU modules. The speed of the fan can be controlled by based on the temperature of the BBU modules and system design requirements.

Figure 9:
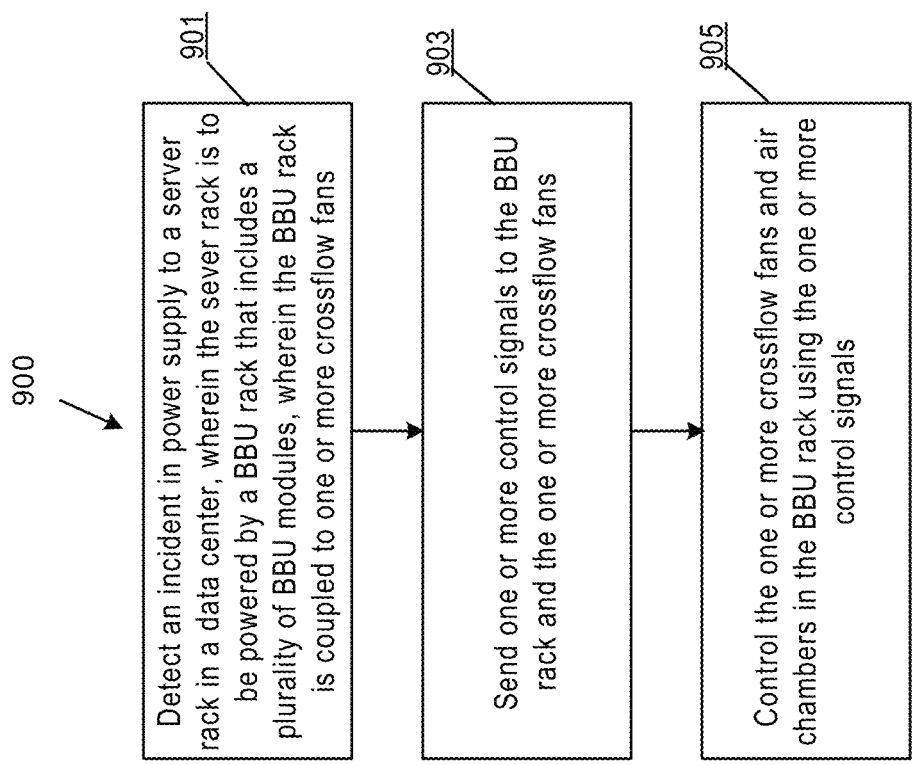
FIG. 9 is a flow diagram illustrating another process of managing airflows using crossflow fans according to one embodiment

FIG. 9 is a flow diagram illustrating another process 900 of managing airflows using crossflow fans according to one embodiment. Process 900 may be performed by processing logic which may include software, hardware, or a combination thereof. For example, process 900 may be performed by a rack management controller 206 described in FIG. 2.

In operation 901, the processing logic detects an incident in power supply to a server rack in a data center, wherein the sever rack is to be powered by a BBU rack that includes a plurality of BBU modules, wherein the BBU rack is coupled to one or more crossflow fans. In operation 903, the processing logic sends one or more control signals to the BBU rack and the one or more crossflow fans. In operation 905, the processing logic controls the one or more crossflow fans and air chambers in the BBU rack using the one or more control signals.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A system for managing airflows in a backup battery unit (BBU) rack, comprising:
    the BBU rack comprising a plurality of BBU modules provided within the BBU rack, wherein the BBU rack is configured to power a server rack in a data center;
    one or more crossflow fans, wherein each of the one or more crossflow fans is configured to dynamically adjust its air blowing direction in real time; and
    a rack management controller that is connected to the server rack, the BBU rack, and the one or more crossflow fans, wherein the rack management controller is configured to
        detect an incident in power supply to the server rack, and
        in response to the incident, send control signals to the BBU rack to control a plurality of air chambers therein, and to the one or more crossflow fans to diffuse cooling air into one or more of the plurality of BBU modules.

2. The system of claim 1, wherein each of the one or more crossflow fans is connected to one or more of the plurality of air chambers of the BBU rack via an air channel, each air chamber corresponding to one of the plurality of BBU modules.

3. The system of claim 1, wherein the BBU rack is to power the server rack as a backup power source or a supplemental power source.

4. The system of claim 3, wherein the BBU rack functions as a backup power source to the server rack when the rack management controller detects a power outage.

5. The system of claim 4, wherein the rack management controller sends the control signals to the BBU rack to open each of the plurality of air chambers between the BBU rack and the one or more crossflow fans.

6. The system of claim 4, wherein the rack management controller sends additional control signals to the one or more crossflow fans to control their speed based on a temperature of the server rack.

7. The system of claim 3, wherein the BBU rack functions as a supplemental power source to the server rack when the rack management controller detects that a sever rack requires a peak power operation.

8. The system of claim 7, wherein the rack management controller identifies one or more of the plurality of BBU modules in the BBU rack that are to provide supplemental power to the server rack, and sends the control signals to the one or more crossflow fans to match their respective airflow blowing directions to one or more air channels connected to the one or more of the plurality of BBU modules.

9. A method of managing airflows in a backup battery unit (BBU) rack, comprising:
   detecting an incident in power supply to a server rack in a data center, wherein the server rack is to be powered by a BBU rack that includes a plurality of BBU modules, where the BBU rack is coupled to one or more crossflow fans;
   sending one or more control signals to the BBU rack and the one or more crossflow fans; and
   controlling the one or more crossflow fans and air chambers in the BBU rack using the one or more control signals,
   wherein a rack management controller identifies one or more of the plurality of BBU modules in the BBU rack that are to provide supplemental power to the server rack, and sends the one or more control signals to the one or more crossflow fans to match their respective airflow blowing directions to one or more air channels connected to the one or more of the plurality of BBU modules.

10. The method of claim 9, wherein each of the one or more crossflow fans is connected to one or more of the air chambers of the BBU rack via an air channel, each air chamber corresponding to one of the plurality of BBU modules.

11. The method of claim 9, wherein the BBU rack is to power the server rack as a backup power source or a supplemental power source.

12. The method of claim 11, wherein the BBU rack functions as a backup power source to the server rack when the rack management controller detects a power outage.

13. The method of claim 12, wherein the one or more control signals to the BBU rack are to open each of the air chambers between the BBU rack and the one or more crossflow fans.

14. The method of claim 13, wherein the one or more control signals to the one or more crossflow fans are to control their speed based on a temperature of the server rack.

15. The method of claim 12, wherein the BBU rack functions as a supplemental power source to the server rack when the rack management controller detects that the server rack requires a peak power operation.

\* \* \* \* \*